United States Patent [19]
Drake et al.

[11] Patent Number: 5,457,311
[45] Date of Patent: Oct. 10, 1995

[54] INTEGRATED CIRCUIT FAN-IN FOR SEMICONDUCTOR TRANSDUCER DEVICES

[75] Inventors: Donald J. Drake, Rochester; William G. Hawkins, Webster; Thomas A. Tellier, Williamson, all of N.Y.

[73] Assignee: Xerox Corporation, Stamford, Conn.

[21] Appl. No.: 92,640

[22] Filed: Jul. 16, 1993

[51] Int. Cl.⁶ .............................. H01J 40/14; H01L 27/14
[52] U.S. Cl. ..................... 250/208.1; 257/225; 257/234; 257/620; 358/482
[58] Field of Search ..................................... 257/234, 225, 257/620; 250/208.1; 346/140 R; 358/482, 483, 513, 514

[56] References Cited

U.S. PATENT DOCUMENTS

| | | | |
|---|---|---|---|
| 4,695,716 | 9/1987 | Tandon et al. | 250/208.1 |
| 4,712,018 | 12/1987 | Stoffel et al. | 250/208.1 |
| 4,829,324 | 5/1989 | Drake et al. | 346/140 R |
| 4,860,075 | 8/1989 | Araghi et al. | 257/620 |
| 4,870,483 | 9/1989 | Nishigaki et al. | 358/483 |
| 4,999,484 | 3/1991 | Kaneko | 250/208.1 |
| 5,272,113 | 12/1993 | Quinn | 250/208.1 |

Primary Examiner—Gene M. Munson
Attorney, Agent, or Firm—Oliff & Berridge

[57] ABSTRACT

A wide semiconductor transducer device comprises a linear array of semiconductor chips. Each of the semiconductor chips has a plurality of transducer elements arranged on it along a front edge at a constant spacing, the constant spacing being maintained across the semiconductor chip boundaries. Each of the semiconductor chips also includes associated transducer circuits which are each connected one of the plurality of transducer elements formed on the semiconductor chip. While the requirement that the transducer elements maintain the constant spacing requires them to be located within a damage zone created during the dicing and/or thermally induced compression of the semiconductor chip, the associated transducer circuits can be located within an interior portion of the semiconductor chip. The interior portion of the semiconductor chip is located a sufficient distance from the edges of the semiconductor chip such that it does not encroach on the damage zone.

14 Claims, 4 Drawing Sheets

INTEGRATED CIRCUIT FAN-IN FOR SEMICONDUCTOR TRANSDUCER DEVICES

BACKGROUND OF THE INVENTION

1. Field of the Invention

This invention relates generally to semiconductor transducer devices. In particular, this invention relates to forming a wide semiconductor transducer device by arranging a plurality of semiconductor transducer device subelements in a linear array.

2. Description of Related Art

Wide semiconductor transducer devices are well known. Examples of such wide semiconductor transducer devices include page-width-wide electro-optical semiconductor sensors, such as photodiode arrays (CCDs) or the like, which are used in facsimile machines, image scanners and xerography machines. Another example of a wide semiconductor transducer device is a page-width-wide electro-optical semiconductor printbar, such as printbars formed of arrays of semiconductor light-emitting diodes (LEDs) or the like. A third example of a semiconductor transducer device is the array of semiconductor heater elements used in page-width-wide direct thermal printbars or page-width-wide thermal ink jet printbars. A common feature of all of these wide semiconductor transducer devices is the demand by users of such devices for input or output resolutions of 300 pixels per inch to 600 pixels per inch or better.

One known method for forming such wide semiconductor transducer devices is to form the full semiconductor transducer device out of a linear array of semiconductor transducer device subunits. A plurality of semiconductor transducer elements is formed in a linear array or along multiple lines of each of the semiconductor transducer device subunits at a spacing corresponding to the desired resolution. The associated transducer circuits for each of the plurality of transducer elements formed on a transducer subunit are also formed on the semiconductor transducer subunit. The associated transducer circuits are often switches to activate heater elements or pass transistors and amplifiers for photo site signal or information access. Frequently, the associated circuit elements take up a large surface area compared to the transducer elements themselves.

Each subunit requires that the first and last transducer must be located close to the lateral edges of the subunit. The subunits must also be butted together or positioned in close proximity, so that the relative spacing between the edge transducers on adjacent chips is the same as the spacing between transducer elements within a chip.

As the resolution of wide semiconductor transducer devices has risen, the center-to-center spacing between adjacent transducer elements has fallen. For instance, in the case of a 600 pixel per inch thermal ink jet printer using a wide semiconductor transducer device, the center-to-center spacing is on the order of 42–43 microns. As the transducer element itself is on the order of 25–26 microns wide, the distance between the right edge of the left hand one of a pair of adjacent transducer elements and the left edge of the right hand transducer element is on the order of 12 to 14 microns. Accordingly, to ensure constant spacing along the entire semiconductor transducer device, the leftmost and rightmost transducer elements on one of the semiconductor transducer device subunits must be placed within 6 to 7 microns of the side edges of the semiconductor transducer device subunit.

However, when the semiconductor transducer device subunits are diced or cut from a semiconductor wafer during processing, cutting the chip out of the wafer can cause structural damage to the transducer device subunit or chip. A damage zone extends into the chip, in a direction perpendicular to the line of cut, up to 10 to 20 microns away from the edge. While the transducer elements themselves are usually sufficiently structurally robust to withstand the damage caused by dicing, the associated transducer circuits are usually not robust enough to withstand the dicing damage. Accordingly, while the small size of the transducer elements makes the probability of damage to them small, the associated transducer circuits within the zone of dicing damage are usually damaged during dicing. Such damage usually renders the corresponding transducer element inoperative, requiring costly post-processing repairs at best and making the semiconductor transducer subunit worthless for its intended purpose at worst.

Further, while the transducer elements are usually sufficiently robust, they are still susceptible to dicing damage. Thus, the yield of the process for making the transducer chips is not 100%, as some chips are still lost through dicing damage. However, the yield is optimized by locating the associated transducer circuitry (and the transducer elements) away from the chip edges.

SUMMARY OF THE INVENTION

The invention provides a wide semiconductor transducer device with semiconductor transducer device subunits having transducer elements and associated transducer circuits which avoid damage to the associated transducer circuits caused by dicing.

The invention also provides a method for manufacturing a semiconductor transducer device subunit which has a low probability of damage or remains undamaged when it is diced out of the semiconductor wafer.

These and other objectives and advantages are provided in a preferred embodiment of the invention by a wide semiconductor transducer device comprising a plurality of semiconductor chips arranged in a linear array to form the semiconductor transducer device, a plurality of transducer elements formed on each one of the semiconductor chips and arranged along the front edge of the chips at a substantially constant spacing, a plurality of associated transducer circuits formed on each of the plurality of semiconductor chips and positioned on an interior portion of the chips and spaced sufficiently from the edges of the chips such that they are not damaged by dicing the semiconductor chip out of the semiconductor wafer.

These and other features and advantages are described in or are apparent from the following detailed description of the preferred embodiment.

BRIEF DESCRIPTION OF THE DRAWINGS

The invention will be described in relation to the following drawings in which like reference numerals refer to like elements and wherein.

DETAILED DESCRIPTION OF THE PREFERRED EMBODIMENTS

Figure 1:
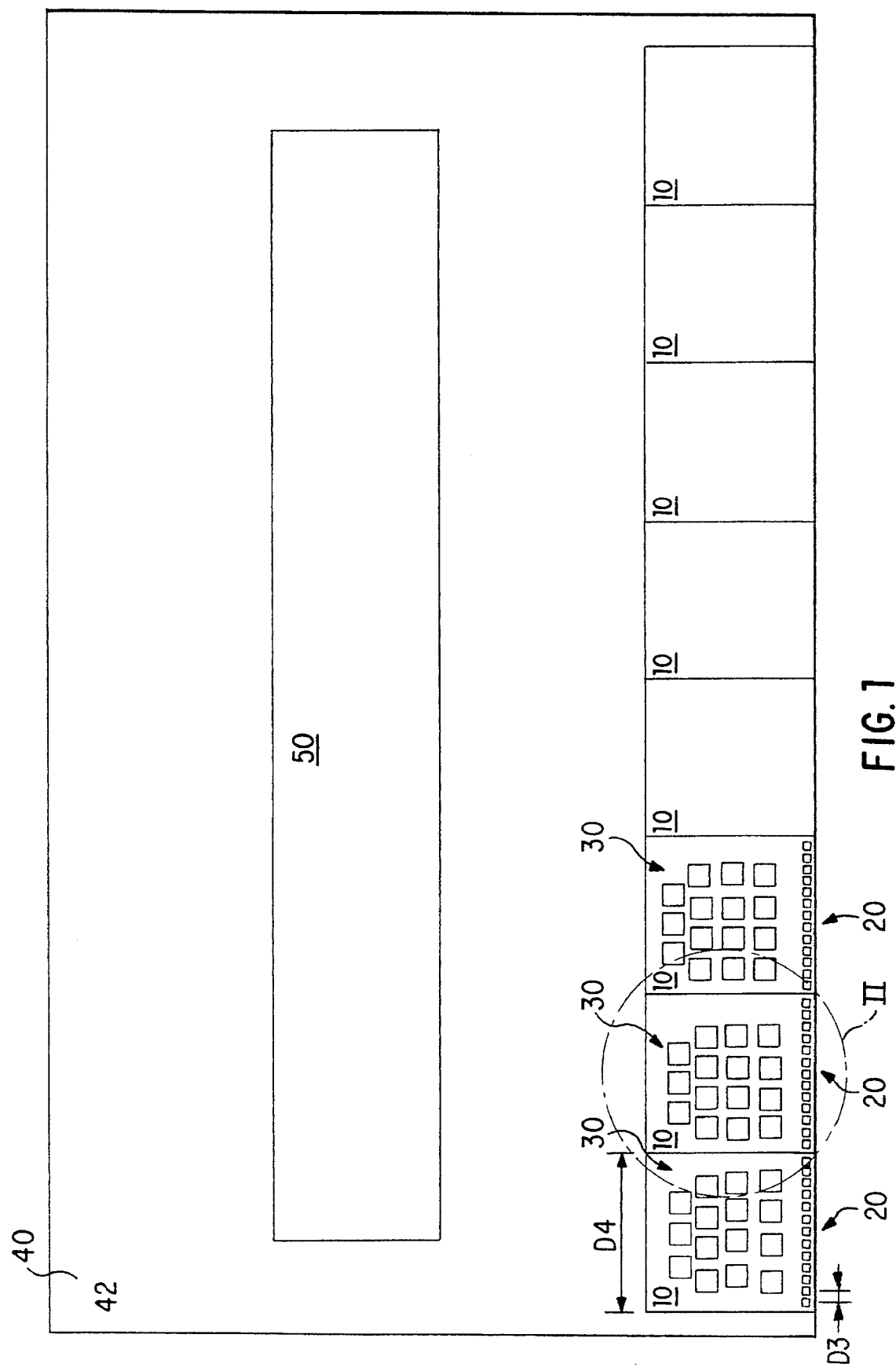
FIG. 1 is a block diagram of a wide semiconductor transducer device.

FIG. 1 shows a block diagram of a wide semiconductor transducer device 40. Such wide semiconductor transducer devices are generally incorporated into thermal ink jet printers or direct thermal printers for directly outputting an image to an image receiving member, electrooptical printbars for use in conjunction with a photoconductive image receiving member for use in a laser printer or xerographic copier, or as optoelectrical sensors for use in a facsimile machine, scanner or xerographic copier for converting an image to electronic data signal. In this way, a page-width-wide transducer device can be used to replace, for example, a movable printhead on a thermal ink jet printer.

Figure 2:
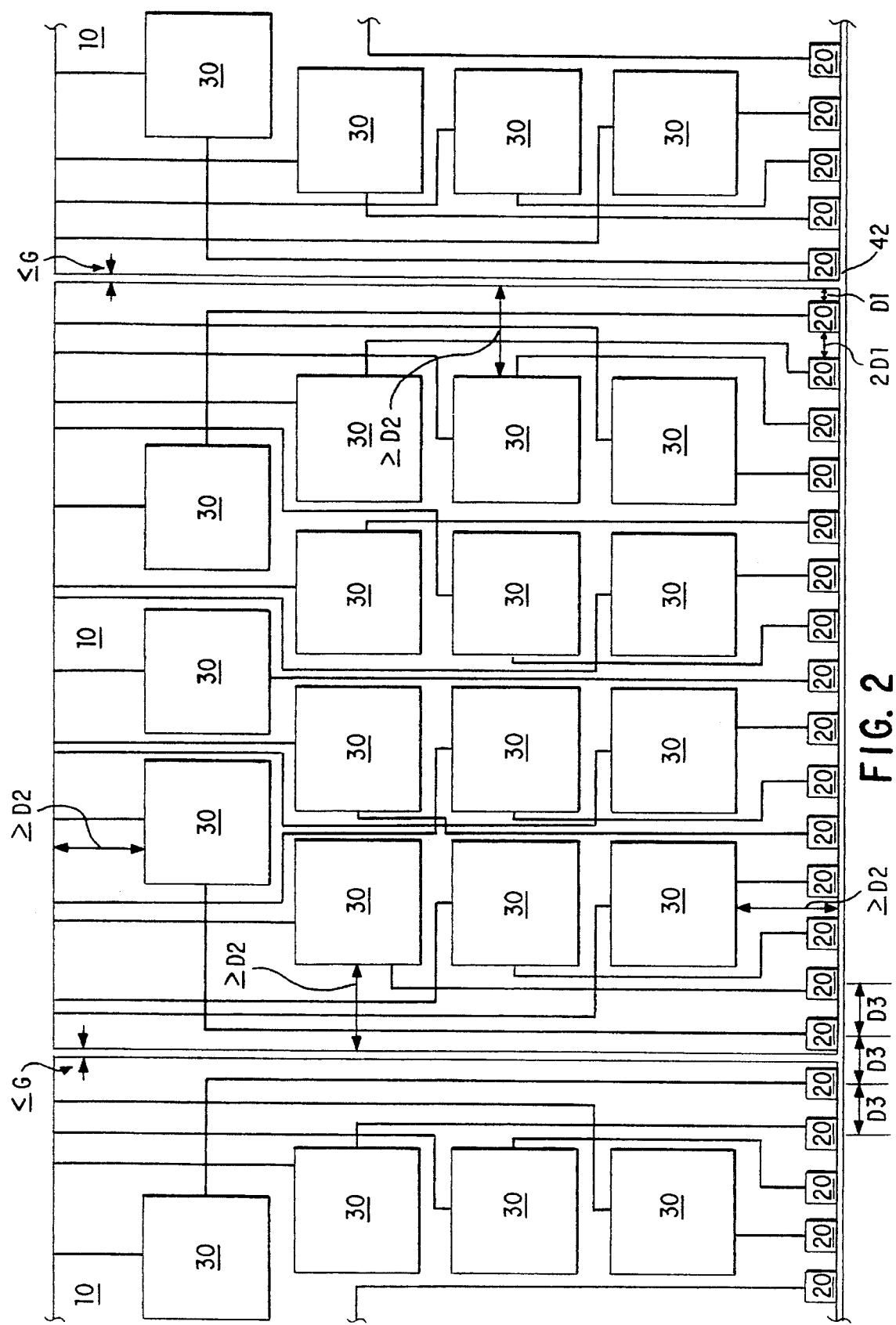
FIG. 2 is an enlarged view of the semiconductor transducer device of FIG. 1.

As shown in FIG. 1, the wide semiconductor transducer device 40 comprises a base 42, ancillary device circuitry 50 and a plurality of semiconductor chips 10. The plurality of semiconductor chips 10 are arranged in a linear array along one edge of the base 42. The semiconductor chips 10 are tightly abutted against one another along their side edges 12 and 14, as shown in FIG. 2. The transducer circuitry 50 is connected to an electronic subsystem (not shown), which generates the data signals for the transducer elements 20 and includes a power supply, by a printed wiring board (not shown). The printed wiring board contains circuit paths connecting the transducer circuits 30 to the electronic subsystem and the power supply.

As shown in FIG. 1, each semiconductor chip 10 has a plurality of transducer elements 20 formed along the front edge 11 which is aligned with the front edge of the base 42. The transducer elements 20 are arranged along the front edge 11 of the corresponding semiconductor chip 10 at a constant center-to-center spacing D3. As shown in FIG. 1, the constant center-to-center spacing D3 between adjacent transducer elements 20 is maintained even when the adjacent transducer elements 20 are formed on adjacent semiconductor chips 10.

In addition, each semiconductor chip 10 has a plurality of associated transducer circuits 30 formed on an interior portion 15 of the semiconductor chip 10. There is generally a one-to-one correspondence between the plurality of transducer elements 20 on each semiconductor chip 10 and the plurality of associated transducer circuits 30 on each semiconductor chip 10. However, the associated transducer circuits 30 can include circuits providing data inputs or outputs or control signals to groups of two or more transducer elements simultaneous. Therefore, the number of associated transducer circuits 30 need not equal the number of transducer elements 20, and there can be more or less associated transducer circuits 30 than transducer elements 20.

The associated transducer circuits 30 are electrically connected to transducer elements 20 and are used to control an actuation signal to, or a data signal to or from, the transducer elements 20. For example, in a thermal ink jet printer, the transducer circuitry 30 comprises a power MOS driver connected between a resistive heater transducer element 20 and ground. When the power MOS driver is activated, it switches on to complete the circuit between the resistive heater transducer element 20 and ground to allow current to flow through the resistive heater transducer element 20 and heat up the ink within the resistive heater transducer element 20. In general, the associated transducer circuits 30 are used to address, interrogate and/or amplify the input and/or output of the transducer element 20.

As shown in FIG. 2, the center-to-center distance D3 between any two adjacent transducer elements 20 is constant, whether the adjacent transducer elements 20 are carried on the same semiconductor chip 10 or whether they are carried on adjacent semiconductor chips 10. In order to ensure that the center-to-center spacing D3 remains constant when adjacent transducer elements 20 are carried on adjacent semiconductor chips 10, the right edge of the left hand transducer element 20 must be within a distance D1 of the right hand edge 14 of the semiconductor chip 10. Likewise, the left hand edge of the right hand transducer element 20 must be within the distance D1 of the left hand edge 12 of the right hand semiconductor chip 10. Furthermore, the gap G between the left hand and right hand adjacent semiconductor chips 10 is preferably substantially zero, as the chips are in physical contact. In any case, the gap is preferably substantially less than 1 µm in order to ensure the proper center-to-center spacing.

Figure 3:
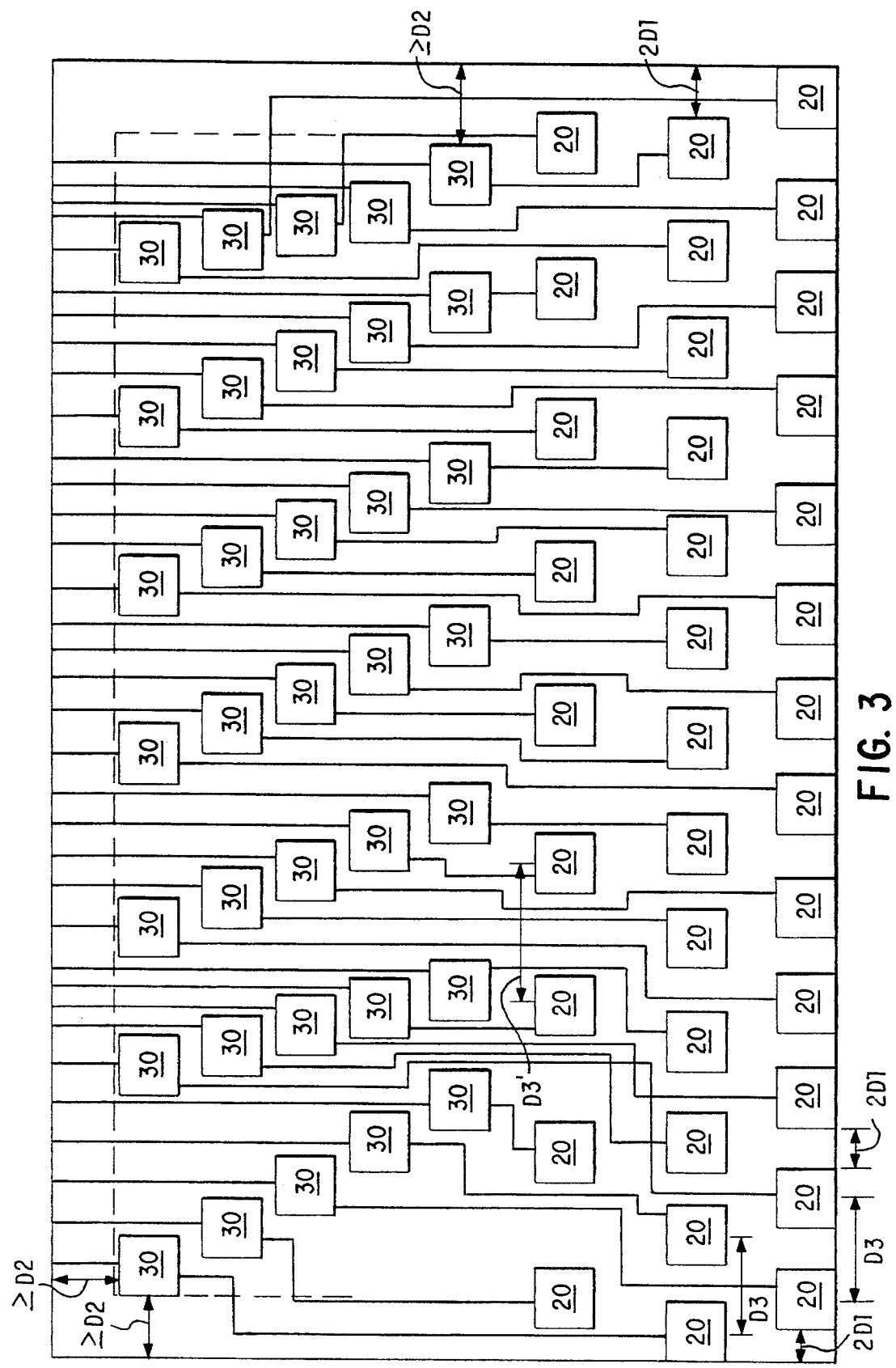
FIG. 3 is a plan view of a multi-line wide semiconductor device.

In an alternate embodiment, as shown in FIG. 3, the transducer elements 20 are not located right along the front edge 11. Instead, especially when the transducer elements 20 are photoreceptors, the transducer elements 20 are set in from the front edge 11. In this case, the transducer elements 20 are set in far enough from the front edge 11 so that they are entirely out of the damage zone.

In addition, as shown in FIG. 3, the transducer elements 20 can be provided in two or more lines. However, each line must still be essentially parallel to the front edge 11. Also, each line must also maintain a constant spacing between the transducer elements 30 of the line. However, as shown in FIG. 3, the spacing between the transducer elements 20 of different line can be different. Finally, even if two lines having the same spacing between the transducer elements 20, the transducer elements 20 of one line can be offset from the transducer elements of another line, as shown in FIG. 3.

In general, in thermal ink jet printers having wide printbars, for printbars having a resolution of 300 to 600 pixels per inch, the center-to-center distance D3 of the transducer elements 20 will be on the order of 40 to 85 µm. As the transducer elements 20 for a resolution of 300 to 600 pixels per inch will have a width of 56 to 28 µm, respectively, the separation of two times the distance D1 between the right hand edge 22 of the left hand adjacent transducer element 20 and the left hand edge 21 of the right hand adjacent transducer element 20 will be 12 to 28 µm. Accordingly, the distance D1 will be on the order of 6 to 14 µm for transducer devices having resolutions between 600 pixels per inch and 300 pixels per inch, respectively.

However, the semiconductor chips 10 which carry the transducer devices 20 and the associated transducer circuits 30 are commonly formed by known manufacturing techniques for forming circuits on a semiconductor wafer such as silicon. In general, a very large number of semiconductor chips 10 will be formed in a single silicon wafer. Accordingly, it is necessary to cut or "dice" the semiconductor chips 10 out of the silicon wafer. Numerous methods are available for doing this. In one known method, V-shaped grooves are etched in the silicon wafer to outline the semiconductor chips 10. Then the silicon wafer is cut along the V-shaped grooves to produce a nearly damaged-free semiconductors chip 10. While this method is able to produce a semiconductor chip 10 which is free from damage due to the dicing, the V-shaped grooves can be formed only by precisely aligning a photolithographic mask over the silicon wafer and then using a nonstandard etching technique to form the V-shaped grooves. The requirement for a precisely aligned photolithographic mask significantly raises the cost of the semiconductor chips 10 while the use of a non-standard etching step and misalignments of the photolithographic mask significantly reduce the yield rate of usable semiconductor chips 10.

In contrast, standard dicing techniques do not require the use of a V-shaped groove, the corresponding photolithographic mask or the nonstandard etching. However, standard dicing techniques can produce, depending on the particular dicing technique used, structural damage to the silicon substrate of the semiconductor chips 10, and therefore the transducer elements 20 and associated transducer circuits 30 formed on the silicon substrate, up to 10 to 20 μm from the edges 11, 12, 13 and 14 of the semiconductor chips 10.

As transducer device resolutions of 300 to 600 pixels per inch require placing the transducer elements to within 6 to 14 micrometers of the edges 12 and 14 in the semiconductor chip 10, it is possible for standard dicing techniques to damage the transducer elements 20. Fortunately, the transducer elements 20 are generally robust and are able to withstand the structural damage in the silicon substrate of the semiconductor chip 10 or the transducer element 20 which arises from the standard dicing method. Unfortunately, the same is not true of the associated transducer circuits 30. In general, such circuits, such as MOS power drivers, logic gates and the like, is not sufficiently robust to withstand the structural damage in the silicon substrate or in the transducer circuits 30 arising from the dicing techniques.

In general, the dicing damage zone will extend into the chips 10 at least 2–5 microns and at most 10–20 microns. Therefore, if an associated transducer circuit 30 is placed within 5 microns of the edges of the chip 10, the associated transducer circuit 30 is substantially guaranteed to be damaged, thereby causing the chip 10 to fail. However, if none of the associated transducer circuits 30 are placed closer than 10 microns from the edges of the chip 10, the associated transducer circuits 30 are much more likely to be outside the dicing damage zone. Thus, the chip 10 is much more likely to survive any dicing damage. Further, if none of the associated transducer circuits 30 are placed closer than 20 microns from the edges of the chip 10, there is an almost 100% likelihood that they will be outside the dicing damage zone. Thus, the chip 10 is substantially guaranteed to survive the dicing damage.

Accordingly, in the semiconductor chips 10 of the present invention, the plurality of associated transducer circuits 30 corresponding to the transistor elements 20 on any one semiconductor chip 10 is formed in an interior portion 15 of the semiconductor chip 10. The interior portion 15 of the semiconductor chip 10 is spaced a distance D2 from each of the edges 11, 12, 13 and 14 of the semiconductor chip 10. In general, the distance D2 is at least 10 μm to 20 μm, depending upon the dicing technique to be used on the semiconductor chips 10. However, D2 is preferably at least 20 μm, to minimize the possibility that the associated transducer circuits will be damaged and so that the semiconductor chips 10 can be diced using any known techniques without the need for reconfiguring the placement of the associated transducer circuits 30 on the semiconductor chip 10.

Further, placing the interior portion 15 from the edges 11, 12, 13 and 14 of the semiconductor chip 10 merely guarantees a minimum distance from the associated transducer circuits 30 to edges 11, 12, 13 and 14 of the semiconductor chip 10. As shown in FIG. 2, it is likely that the distance between the associated transducer circuits 30 and the edges 11, 12, 13 and 14 of the semiconductor chip 10 will be greater than the distance D2.

In general, as there is no correlation between the necessary spacing and positioning of the transducer elements 20 and the spacing and positioning of the associated transducer circuits 30, the associated transducer circuits 30 can be located anywhere within the interior portion 15 of the semiconductor chip 10. That is, there is no need for the associated transducer circuits 30 to maintain the constant spacing D3 necessary for the transducer elements 20.

Figure 4:
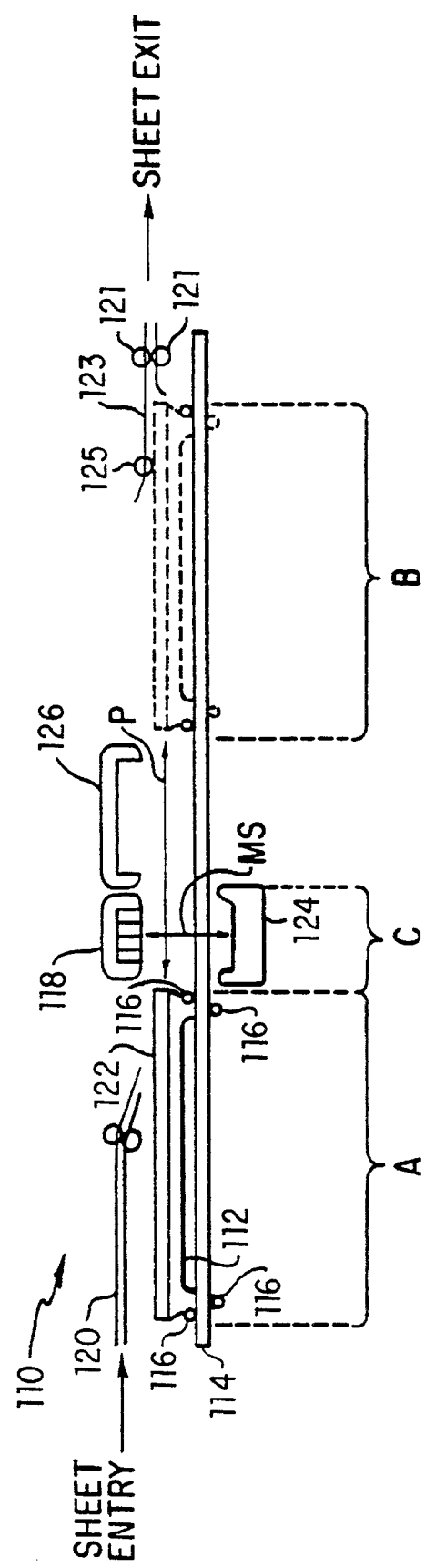
FIG. 4 is an exemplary device having a wide transducer bar.

FIG. 4 shows an exemplary device 110 incorporating a wide transducer bar 118. The transducer bar 118 is a wide thermal ink jet printbar, a wide photodiode scanner or the like. A platen 112 moves transversely between the left side and the right side of the transducer bar 118. The platen 112 carries an image recording member or an image bearing member, such as a sheet of paper.

The platen 112 moves on a pair of guide rods 114. Rollers 116 are attached to the platen 112 and move the platen 112 along the guide rods 114 so that the platen 112 remains consistently within the plane P. The wide transducer bar 118 is positioned within a zone C between a left hand end position A of the platen 112 and a right hand end position B. The image recording or bearing member enters the system via an input path 120. The sheet is supplied to and aligned on the platen 112.

Once the sheet is aligned on the platen 112, the platen 112 linearly travels from position A to position B along the guide rods 114. As the platen 112 travels, it passes by the wide transducer bar 118. The wide transducer bar 118 then prints an image on the sheet, in the case of an image recording member, or inputs an image, in the case of an image bearing member. When the platen reaches the end position B, the sheet is removed from the platen 112 and fed along a sheet output path 123.

While the invention has been described in connection with the preferred embodiment, it would be understood that it is not intended to limit the invention to this embodiment. On the contrary, it is intended to cover all alternatives, modifications and equivalents and it may be included within the spirit and scope of the invention as defined by the appended claims.

What is claimed is:

1. A thermal ink jet printer having a wide printbar, the wide printbar comprising:

a plurality of semiconductor chips, each one of the plurality of chips having a substantially flat front edge, a rear edge, and two substantially flat side edges, the plurality of chips being arranged in a linear array, wherein adjacent ones of the plurality of chips are accurately positioned along adjacent side edges;

a plurality of ink jet heater elements formed on each of the plurality of semiconductor chips, each plurality of ink jet heater elements arranged along at least one substantially straight line parallel to the front edge of the corresponding chip at a substantially constant spacing, wherein adjacent ones of the pluralities of ink jet heater elements on adjacent ones of the plurality of semiconductor chips are spaced at a first distance substantially equal to the constant spacing, such that the pluralities of ink jet heater elements are arranged in a linear array substantially at the constant spacing; and a plurality of switch circuits formed on each of the plurality of semiconductor chips, each plurality of switch circuits arranged on an interior portion of one of the plurality of chips and spaced at least a second distance from the front edge, the rear edge and the two side edges of the corresponding chip, each one of the plurality of switch circuits electrically connected to at least one of the plurality of heater elements.

2. The wide printbar of claim 1, further comprising:
at least one control circuit connected to each one of the plurality of ink jet heater elements and each one of the plurality of switch circuits of each of the plurality of semiconductor chips.

3. An optical input device having a wide photoreceptor array, the wide photoreceptor array comprising:
a plurality of semiconductor chips, each one of the plurality of chips having a substantially flat front edge, a rear edge, and two substantially flat side edges, the plurality of chips being arranged in a linear array, wherein adjacent ones of the plurality of chips are accurately positioned along adjacent side edges;
a plurality of photoreceptor elements formed on each of the plurality of semiconductor chips, each plurality of photoreceptor elements arranged along at least one substantially straight line parallel to the front edge of the corresponding chip at a substantially constant spacing, wherein adjacent ones of the pluralities of photoreceptor elements on adjacent ones of the plurality of semiconductor chips are spaced at a first distance substantially equal to the constant spacing, such that the pluralities of photoreceptor elements are arranged in a linear array substantially at the constant spacing; and
a plurality of amplifier circuits formed on each of the plurality of semiconductor chips, each plurality of amplifier circuits arranged on an interior portion of one of the plurality of chips and spaced at least a second distance from the front edge, the rear edge and the two side edges of the corresponding chip, each one of the plurality of amplifier circuits electrically connected to at least one of the plurality of photoreceptor circuits.

4. The wide photoreceptor array of claim 3, further comprising at least one control circuit connected to each one of the plurality of photoreceptor elements and each one of the plurality of amplifier circuits of each of the plurality of semiconductor chips.

5. A semiconductor transducer device, comprising:
a plurality of semiconductor chips, each one of the plurality of chips having a substantially flat front edge, a rear edge, and two substantially flat side edges, the plurality of chips being arranged in a linear array, wherein adjacent ones of the plurality of chips are accurately positioned along adjacent side edges;
a plurality of transducer elements formed on each of the plurality of semiconductor chips, each plurality of transducer elements arranged in at least one substantially straight line parallel to the front edge of the corresponding chip at a substantially constant spacing, wherein adjacent ones of the pluralities of transducer elements on adjacent ones of the plurality of semiconductor chips are spaced at a first distance substantially equal to the constant spacing, such that the pluralities of transducer elements are arranged in a linear array substantially at the constant spacing; and
a plurality of associated transducer circuits formed on each of the plurality of semiconductor chips, each plurality of associated transducer circuits arranged on an interior portion of one of the plurality of chips and spaced at least 10 microns from the front edge, the rear edge and the two side edges of the corresponding chip, each one of the plurality of associated transducer circuits electrically connected to at least one of the plurality of transducer elements.

6. The semiconductor transducer device of claim 5, wherein the constant spacing is a center-to-center distance between adjacent transducer elements, the center-to-center distance being in the range of 40–85 microns.

7. The semiconductor transducer device of claim 5, wherein adjacent ones of the plurality of chips in the linear array are tightly butted against each other along adjacent side edges.

8. The semiconductor transducer device of claim 5, wherein adjacent ones of the plurality of chips in the linear array are placed in close proximity to each other, a separation remaining between the adjacent chips.

9. The semiconductor transducer device of claim 5, further comprising at least one general transducer circuit connected to each one of the plurality of transducer elements and each one of the plurality of associated transducer circuits of each of the plurality of semiconductor chips.

10. A semiconductor transducer device, comprising:
a plurality of semiconductor chips, each one of the plurality of chips having a substantially flat front edge, a rear edge, and two substantially flat side edges, the plurality of chips being arranged in a linear array, wherein adjacent ones of the plurality of chips are accurately positioned along adjacent side edges;
a plurality of transducer elements formed on each of the plurality of semiconductor chips, each plurality of transducer elements arranged in at least one substantially straight line parallel to the front edge of the corresponding chip at a substantially constant spacing, wherein adjacent ones of the pluralities of transducer elements on adjacent ones of the plurality of semiconductor chips are spaced at a first distance substantially equal to the constant spacing, such that the pluralities of transducer elements are arranged in a linear array substantially at the constant spacing; and
a plurality of associated transducer circuits formed on each of the plurality of semiconductor chips, each plurality of associated transducer circuits arranged on an interior portion of one of the plurality of chips and spaced at least 20 microns from the front edge, the rear edge and the two side edges of the corresponding chip, each one of the plurality of associated transducer circuits electrically connected to at least one of the plurality of transducer elements.

11. The semiconductor transducer device of claim 10, wherein the constant spacing is a center-to-center distance between adjacent transducer elements, the center-to-center distance being in the range of 40–85 microns.

12. The semiconductor transducer device of claim 10, wherein adjacent ones of the plurality of chips in the linear array are tightly butted against each other along adjacent side edges.

13. The semiconductor transducer device of claim 10, wherein adjacent ones of the plurality of chips in the linear array are placed in close proximity to each other, a separation remaining between the adjacent chips.

14. The semiconductor transducer device of claim 10, further comprising at least one general transducer circuit connected to each one of the plurality of transducer elements and each one of the plurality of associated transducer circuits of each of the plurality of semiconductor chips.

* * * * *